US007924208B2

(12) United States Patent
Sollner et al.

(10) Patent No.: US 7,924,208 B2
(45) Date of Patent: *Apr. 12, 2011

(54) LOW POWER 10 GIGABIT ETHERNET INTERFACE

(75) Inventors: T.C.L. Gerhard Sollner, Winchester, MA (US); Michael P. Anthony, Andover, MA (US)

(73) Assignee: Kenet, Inc., Chelmsford, MA (US)

( * ) Notice: Subject to any disclaimer, the term of this patent is extended or adjusted under 35 U.S.C. 154(b) by 121 days.

This patent is subject to a terminal disclaimer.

(21) Appl. No.: 12/154,443

(22) Filed: May 22, 2008

(65) Prior Publication Data

US 2008/0297393 A1 Dec. 4, 2008

Related U.S. Application Data

(60) Provisional application No. 60/931,746, filed on May 25, 2007.

(51) Int. Cl.
*H03M 1/12* (2006.01)

(52) U.S. Cl. ........................ 341/172; 341/155

(58) Field of Classification Search .............. 375/316; 341/172, 120, 155, 122, 162
See application file for complete search history.

(56) References Cited

U.S. PATENT DOCUMENTS

| 4,072,938 | A | * | 2/1978 | Buchanan | 341/172 |
| 4,716,580 | A | | 12/1987 | Berger | |
| 5,671,252 | A | * | 9/1997 | Kovacs et al. | 375/316 |
| 5,959,563 | A | * | 9/1999 | Ring | 341/155 |
| 6,249,181 | B1 | | 6/2001 | Marble | |
| 6,486,820 | B1 | | 11/2002 | Allworth et al. | |
| 6,489,904 | B1 | * | 12/2002 | Hisano | 341/120 |
| 6,489,914 | B1 | * | 12/2002 | Jones et al. | 341/162 |
| 6,566,943 | B1 | | 5/2003 | Marble | |
| 7,126,523 | B2 | * | 10/2006 | Tadeparthy | 341/162 |
| 7,333,039 | B2 | * | 2/2008 | Lu et al. | 341/122 |
| 2008/0247497 | A1 | * | 10/2008 | Dyer et al. | 375/356 |

OTHER PUBLICATIONS

Kyung, C-M. and Choong-Ki, K., "Pipeline Analog-to-Digital Conversion with Charge-Coupled Devices," *IEEE Journal of Solid-State Circuits*, 15(2):255-257 (Apr. 1980).

Paul, S.A., et al., "A Nyquist-Rate Pipelined Oversampling A/D Converter," *IEEE Journal of Solid-State Circuits* 34(12):1777-1787 (Dec. 31, 1999).

* cited by examiner

*Primary Examiner* — Joseph Lauture
(74) *Attorney, Agent, or Firm* — Hamilton, Brook, Smith & Reynolds, P.C.

(57) ABSTRACT

A low-power communication interface, such as used with 10 Gigabit Ethernet, that uses an analog front end having a charge-domain analog-to-digital converter that uses a charge-domain pipeline.

23 Claims, 11 Drawing Sheets

LOW POWER 10 GIGABIT ETHERNET INTERFACE

RELATED APPLICATIONS

This application claims the benefit of U.S. Provisional Application No. 60/931,746, filed on May 25, 2007 which is related to U.S. patent application Ser. No. 12/009,615 entitled "CHARGE-DOMAIN PIPELINED ANALOG-TO-DIGITAL CONVERTER" filed Jan. 18, 2008, and U.S. patent application Ser. No. 11/807,914 entitled "BOOSTED CHARGE TRANSFER CIRCUIT" filed May 30, 2007. The entire teachings of all of these prior applications are hereby incorporated by reference.

BACKGROUND OF THE INVENTION

The Emerging 10 GE Networking Standard

While the use of 10 Gigabit Ethernet (10 GE) high speed transport over optical connections is growing in core networking infrastructure, the adoption of copper-based 10 GE solutions has been less rapid in data processing environments. Viable transmission techniques do exist for delivering full-duplex 10-gigabit per second (Gbit/s) connections over existing Cat 5e and Cat 6 cabling to provide short reach data links. According to the 10 GE Standards (such as IEEE 802.3 an and subsequent revisions) the approach is to use specially designed quadrature (I and Q) Pulse Amplitude Modulation (PAM) encoding schemes to deliver multi-bits per baud.

Similar to 1000BASE-T, the 10 GE modulation scheme uses full-duplex communication to more efficiently utilize the channel bandwidth, that is, data is transmitted and received simultaneously on the same twisted pair. Since there are four twisted pairs in a Cat 5 or Cat 6 cable, the aggregate bit-rate is 2.5 Gbit/s on each twisted pair in both directions.

Additional overhead for error correction and coding is necessary to obtain further signal-to-noise-ratio benefit. Digital signal processing is thus required to implement receiver functions such as adaptive equalization, echo cancellation, near-end crosstalk (NEXT) cancellation, and far-end crosstalk (FEXT) cancellation.

SUMMARY OF THE INVENTION

However at least one problem with widespread adoption of 10 GE interfaces comes with the details of implementation. Scaling conventional circuits as necessary to handle such high data rates also involves accepting much high power consumption. While this is a particular issue with network infrastructure equipment, such as might be located within a hub at a data center. Existing infrastructure limits the power available for each 10 G port, of which there will be many in a large installation. Replacing this infrastructure is expensive, so keeping the power below this limit is a substantial advantage. Low power is also an advantage for acceptance in personal computer networks, both at home and in business.

Charge-Domain Signal Processing

Charge-domain signal-processing circuits hold one possible solution to this problem. In these circuits, signals are represented as charge packets. These charge packets are stored, transferred from one storage location to another, and otherwise processed to carry out specific signal-processing functions. Charge packets are capable of representing analog quantities, with the charge-packet size in coulombs being proportional to the signal represented. Charge-domain operations such as charge transfer are driven by periodic clock voltages, providing discrete-time processing. This capability is thus well-suited to performing necessary functions such as analog-to-digital conversion (ADC) using pipeline algorithms.

As one example, an Analog Front End component of a 10 GE interface can include a charge domain, pipelined ADC that implements a successive-approximation algorithm by resolving one or more bits at each pipeline stage, adjusting the quantized estimate from the signal at that stage, and propagating the result to the next pipeline stage for further processing.

The pipelined ADC can be implemented using a variety of circuit techniques, including switched-capacitor circuits and charge-domain circuits, but a preferred embodiment of the present invention pertains to charge-domain pipelined ADCs because of the substantially lower power requirements of charge-domain ADCs.

More specifically, the present invention provides a 10 Gigabit Ethernet communication interface that utilizes an analog front end that incorporates a pipelined ADC implemented using charge-domain circuitry in the receive signal path. The result provides a combination of the advantages of low power consumption and high sample rate.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1:
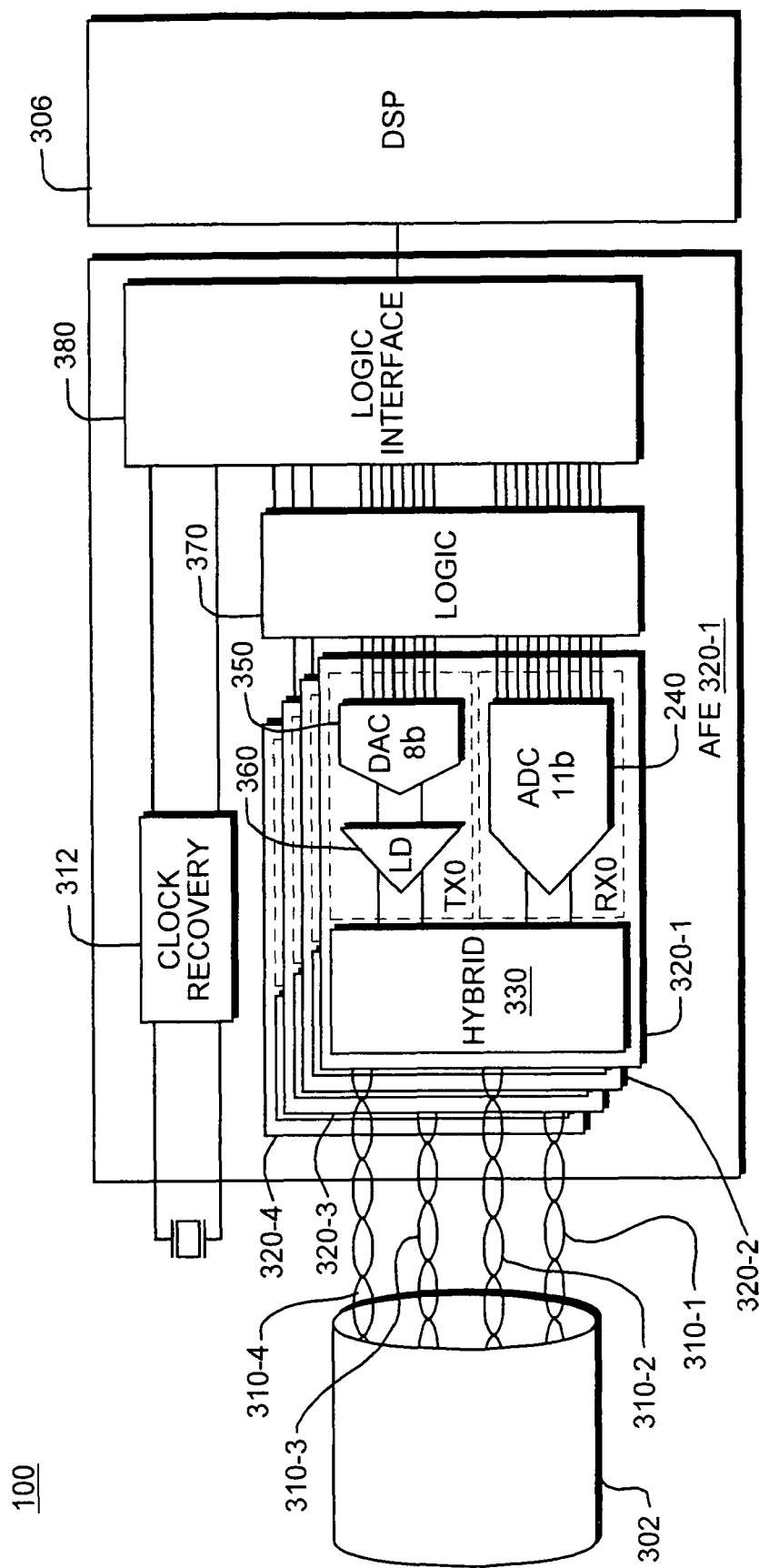
FIG. 1 is a high level diagram of a 10 Gigabit Ethernet interface according to the invention.

FIG. 1 is a high level diagram of a 10 Gigabit Ethernet (10 GE) interface in which a preferred embodiment of the invention may be employed. A Cat 5e or Cat 6 cable 302 has four unshielded twisted pair (UTP) cables 310-1, 310-2, 310-3, 310-4 (collectively the UTP cables 310). Each UTP cable 310 is coupled to an associated one of four Analog Front End (AFE) 320.

An example AFE 320-1 handles transmission and reception of one of the 2.5 Gbit/s full duplex signal transmission expected on each cable 310. The AFE 320-1 includes a hybrid interface 330, an ADC 240 (with 11 bits of resolution in the example shown), a Digital to Analog Converter (DAC) 350 (with 8 bits of resolution) and driver amplifier 360.

Logic 370, logic interface 380, and DSP 306 perform modulation, coding, framing, and other functions as specified by the Physical Layer (PHY), Media Access Control (MAC) and higher layers of the IEEE 802.3an or other 10 GE Standard. Local reference 310 and clock recovery circuits 312 provide clock signals to the other components.

Figure 2:
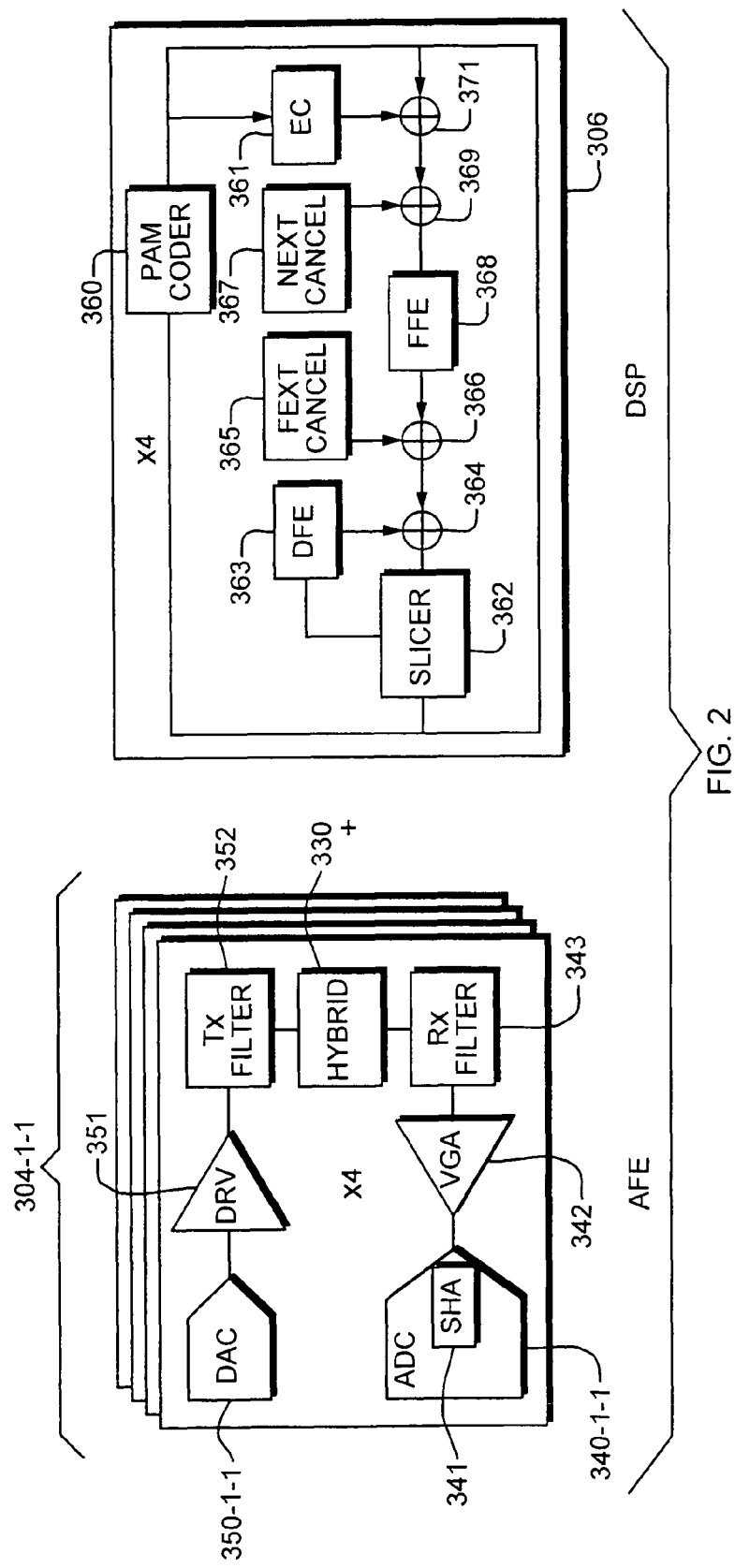
FIG. 2 is a functional diagram of an Analog Front End (AFE) and portions of a Digital Signal Processor (DSP).

FIG. 2 shows more detail of one of the AFEs 304-1. Here the required 800+ Megasample per second (MSPS) ADC function 340-1 is actually implemented as four different interleaved 200+ -MSPS ADC subunits (340-1-1, 340-1-2, 340-1-3, 340-1-4). To achieve the desired 800 MSPS clock rate, the individual clocks fed to the ADC subunits 340-1 are interleaved, e.g., the four subunits take their samples at 0°, 90°, 180° and 270° with respect to a common reference.

The example AFE block 340-1-1 has a corresponding sample and hold amplifier (SHA) 341-1-1, variable gain amplifier (VGA) 342-1-1, receiver filter 343-1-1 on the receive side; and DAC 350-1-1, driver amplifier (DRV) 351-1-, and transmit filter 352-1-1 on the transmit side. A corresponding hybrid 330-1 couples to the cable 310-1.

The DSP 306 (which may also preferably be replicated four times for each 2.5 Gbit/s signal) includes Pulse Amplitude Modulation (PAM) coder 360, error correction (EC) 361, near end cross talk (NEXT) canceller 367, far end crosstalk (FEXT) canceller 365, Digital Front End (DFE) 363, and slicer 362.

Figure 3:
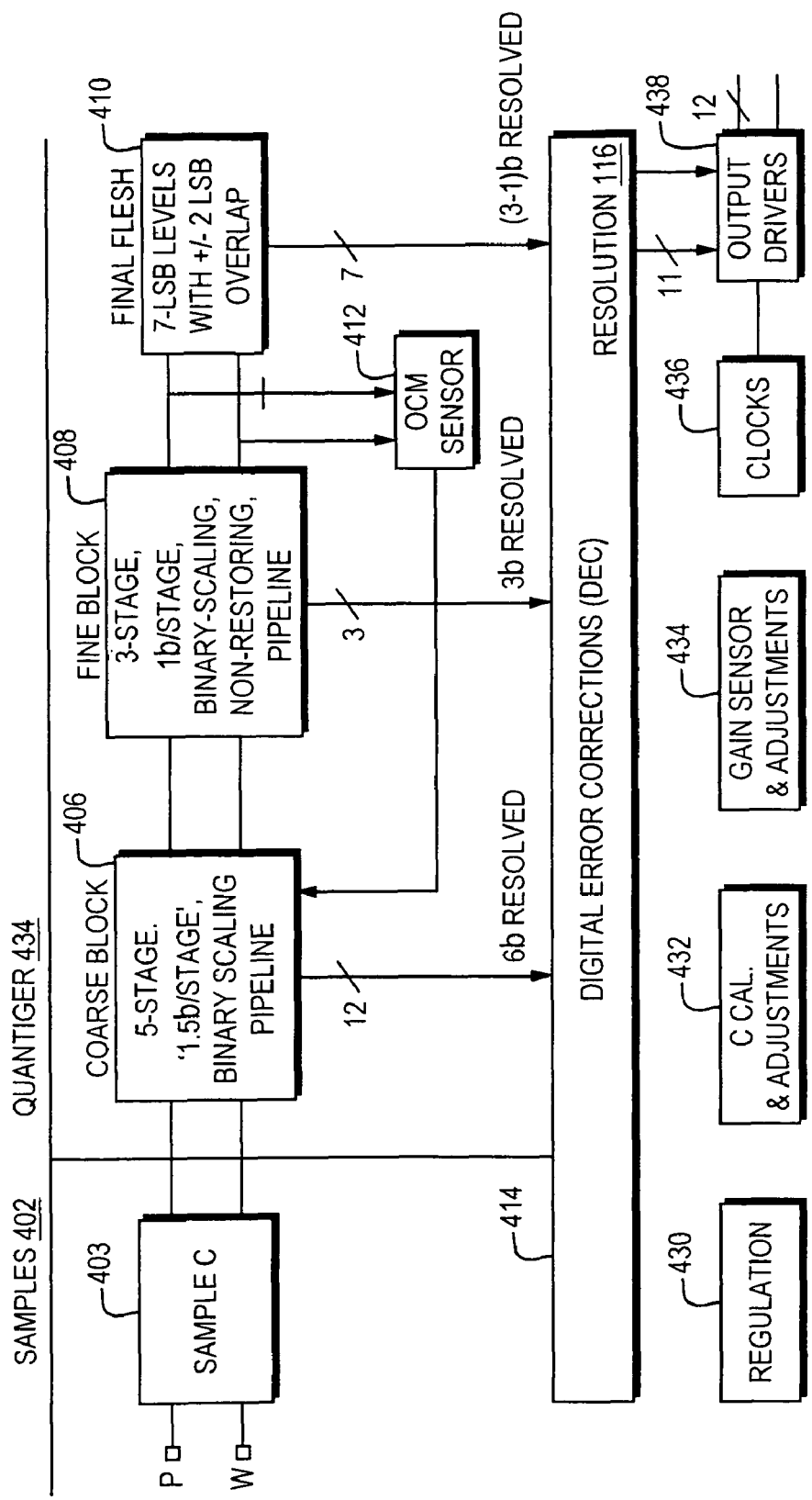
FIG. 3 is a block diagram of an Analog to Digital Converter (ADC) that uses, at least in part, a charge pipeline, successive approximation type circuit with the invention.

FIG. 3 is a more detailed view of a preferred embodiment of one of the successive approximation pipeline ADC subunits 340-1-1. FIG. 3 illustrates an eleven (11) bit converter, although it will be understood that converters of other resolutions are possible.

The illustrated ADC 340-1-1 is a differential pipeline having a plus (P) charge signal path and a minus (M) charge signal path.

The ADC's functions can be generally categorized as a sampler 402 and quantizer 404. The sampler 402 includes a input sampler circuit 403. The quantizer 404 includes a course block 406 (providing 6 resolved bits), fine block 408 (providing 3 resolved bits), and final flash 410 (providing the final 2 resolved bits). The quantizer also includes supporting circuitry, such as the common-mode charge (QCM) sensor 41, Digital Error Correction (DEC) 414 as well as regulators 430, calibration and adjustment circuits 432, gain sensor and adjustment circuits 434, clock circuits 436, and output drivers 438.

According to aspects of the present invention, the coarse block 406 is made up of six (6) stages of a one-and-a-half bit per stage pipeline. The fine block 408 makes use of three (3) stages of a one bit per stage pipeline. The final flash 410 provides seven least significant bit (LSB) levels using known flash converter techniques to provide the final 2 bits to the DEC circuit 414, which combines these with bits from the previous stages to provide the 11-bit output of this converter.

The present invention thus applies course block 406 and fine block 408 pipeline stage designs to novel advantage. Before discussing these designs in detail, some understanding of charge-domain signal-processing circuits is helpful. In such circuits, signals are represented as charge packets. These charge packets are stored, transferred from one storage location to another, and otherwise processed to carry out specific signal-processing functions. Charge packets are capable of representing analog quantities, with the charge-packet size in coulombs being proportional to the signal resented. Charge-domain operations such as charge-transfer are driven by 'clock' voltages, providing discrete-time processing. Thus, charge-domain circuits provide analog, discrete-time signal-processing capability. This capability is well-suited to performing analog-to-digital conversion using pipeline algorithms.

Charge-domain circuits are implemented as charge-coupled devices (CCDs), as MOS bucket-brigade devices (BBDs), and as bipolar BBDs. In a preferred embodiment, the present invention uses MOS BBDs to implement the pipelined analog-to-digital converter (ADC) stages. These pipelined ADCs stage implement the well-known successive-approximation analog-to-digital (A/D) conversion algorithm, in which progressively-refined estimates of an input signal are made at sequential times. In the pipelined version of this algorithm, one or several bits are resolved at each pipeline stage, the quantized estimate is subtracted from the signal, and the residue is propagated to the next pipeline stage for further processing.

A commonly-used variation of the basic successive-approximation algorithm is the Redundant Signed Digit (RSD) algorithm, in which the resolution of each stage is finer than the stage's nominal bit-weight. The RSD algorithm provides intrinsic digital code redundancy, which makes possible the relaxing of precision requirements on the comparators at each stage.

Charge-domain pipelined ADC stages have the advantage of not requiring op-amps as essential components of the pipeline. Instead, they transfer charge packets directly from each pipeline stage to the next with essentially unity charge gain.

Prior-art charge-domain pipelined ADCs have been limited in accuracy or operating speed by various architectural deficiencies. BBD-based ADCs have suffered from non-linearity and other inaccuracies due to the imprecise nature of BBD charge transfer between pipeline stages. CCD-based implementations have suffered from excess power consumption due to the requirement of driving numerous CCD gates with high-speed clock signals.

The preferred implementation provides an improved ADC for use in a 10 GE interface using MOS BBDs. This implementation achieves lower power consumption and improved resolution compared to other charge-domain methods by the use of a tapered pipeline, in which the amount of charge being processed is reduced in later pipeline stages compared to earlier ones. In one embodiment it provides high-speed and high-accuracy (A/D) conversion by employing an improvement on conventional BBDs known as a "boosted" charge-transfer circuit MOS BBD pipelines can be implemented using common-gate FETs as the charge-transfer devices, which convey charge from one pipeline stage to the next. In a previous patent application by the same inventor (U.S. patent application Ser. No. 11/807,914, filed May 30, 2007 entitled "Boosted Charge Transfer Circuit") which is hereby incorporated by reference in its entirety, an improved class of charge-transfer circuits is disclosed and explained in detail. The ADC subunits of the present invention can be implemented using either conventional or boosted charge-transfer circuits; the preferred embodiment employs the boosted charge-transfer circuit, which provides higher operating speed and accuracy. In the following discussion and figures charge-transfer circuits are represented abstractly and some behavioral aspects of these circuits are mentioned, but no details of the operation of such circuits are provided.

In the following description, all circuits are discussed assuming electrons as the signal-charge carriers and NFETs for signal-charge transfer. Identical circuits can be applied equally well using holes as charge carriers, by employing PFETs and reversed signal and control voltage polarities.

Figure 4:
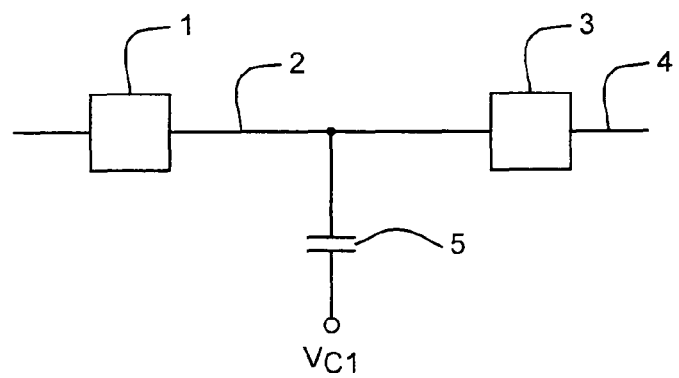
FIG. 4 shows a simplified circuit diagram of a Bucket Brigade Device (BBD) type charge-pipeline stage.

The basic principle of a BBD pipeline of the general type employed in this invention is described with the aid of FIG. 4, which depicts a single stage of such a pipeline. In this stage charge is stored on capacitor 5, which is connected between storage node 2 and voltage $V_{C1}$. Charge enters the stage via charge-transfer circuit 1, and later exits the stage via charge-transfer circuit 3. Voltage $V_{C1}$ is a digital clock signal which controls the timing of charge processing in the stage. Other digital clock signals, not shown, may be used to control the activity of the charge-transfer circuits.

Figure 5:
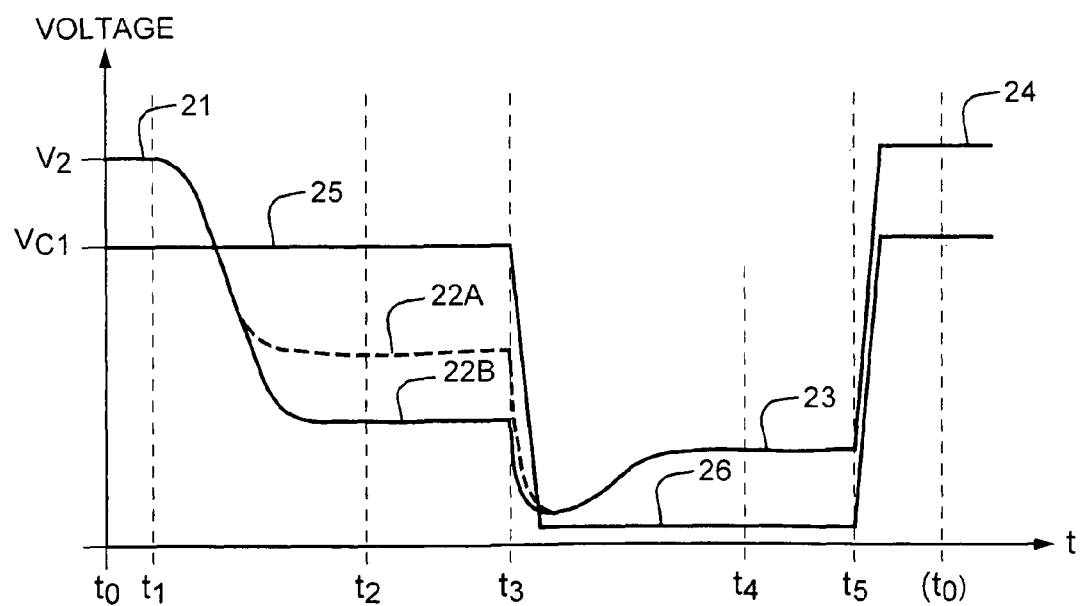
FIG. 5 shows timing diagrams that explain the operation of the pipeline stage of FIG. 4.

Operating waveforms of the pipeline stage are shown in FIG. 5. At time $t_0$ clock voltage $V_{C1}$ has a positive value 25. $V_2$, the voltage of storage-node 2 in FIG. 1, is also at a high initial voltage 21. At $t_1$ negative charge begins to be transferred from the previous stage (to the left of FIG. 4) via charge-transfer circuit 1 into the stage shown. As this negative charge accumulates on capacitor 5, $V_2$ falls to a more negative value. The voltage of node 2 settles to a relatively high value 22A if a relatively small negative charge was transferred; with a larger charge transferred, node 2 settles to a more negative voltage 22B. At time $t_2$ charge transfer into the stage is complete. The voltage of node 2 is related to the charge by the well-known expression Q=CV, where C is the total capacitance of node 2. In FIG. 4, C is comprised of $C_5$, the capacitance of capacitor 5, plus any parasitic capacitance of node 2; such parasitic capacitance is usually small and is neglected in this discussion.

Charge transfer out of the stage begins at time $t_3$ when clock voltage $V_{C1}$ switches to a low state. Capacitor 5 couples this voltage transition to node 2, driving $V_2$ low as well. Charge-transfer circuit 3 absorbs charge from capacitor 5, limiting the negative excursion of node 2, and eventually causing node 2 to settle to voltage 23 at $t_4$. Voltage 23 is a characteristic of charge-transfer circuit 3, and is independent of the amount of charge which had been stored on node 2. Charge-transfer circuit 3 transfers the charge absorbed from capacitor 5 to node 4 which is part of the stage following the one shown. After $t_4$ charge transfer is complete.

Finally, at time $t_5$, clock voltage $V_{C1}$ returns to its initial state (voltage 25). Its positive-going transition is coupled to node 2 by capacitor 5, raising node 2 to voltage 24. Neglecting parasitic capacitance, no charge flows onto or off of node 2 during this transition; the voltage change of $V_2$ is therefore equal to the voltage change of $V_{C1}$ during the transition at $t_5$. Since $V_2$'s value at the start of this transition, voltage 23, is independent of charge processed, voltage 24 is likewise independent of charge processed. This transition completes the operating cycle; the resulting voltage 24 at node 2 is thus the initial voltage for the next cycle. Thus the initial voltage state of the stage is constant cycle-to-cycle, and voltage 21=voltage 24. Consequently the initial and final charge on node 2 are also equal, and the charge transferred out is equal to the charge transferred in.

In summary: charge is transferred into the stage shown in FIG. 4 during $t_1$-$t_2$; between times $t_2$ and $t_3$ it is temporarily stored on capacitor 5, and is manifested as the value of $V_2$; during times $t_3$-$t_4$ this charge is completely transferred to the next stage; at $t_5$ the stage returns to its initial state, ready again to receive incoming charge. Thus the basic stage shown acts as a shift register for analog charge packets.

It should be understood that practical circuits depart in many details from this idealized description. Such departures include non-zero parasitic capacitance and imperfect charge transfer, for example. These effects, however, do not change the basic operating principles described above; and these principles can be applied in practical circuits with sufficient accuracy for useful purposes.

Conventional BBD charge pipelines have generally employed simple two-phase digital clock signals which simultaneously controlled the charge-storage capacitors and the charge-transfer FETs. Pipeline circuits such as that of FIG. 4 and others described below also operate using a two-phase clocking system. In these circuits, however, it is desirable to provide independent control of the activity of the charge-transfer circuits and of other clocked events in the stage such as capacitor switching. For this reason, the circuits of the present invention employ additional clock signals which control charge-transfer circuit activity. These signals and their function will be explained with the aid of FIGS. 6 and 7.

Figure 6:
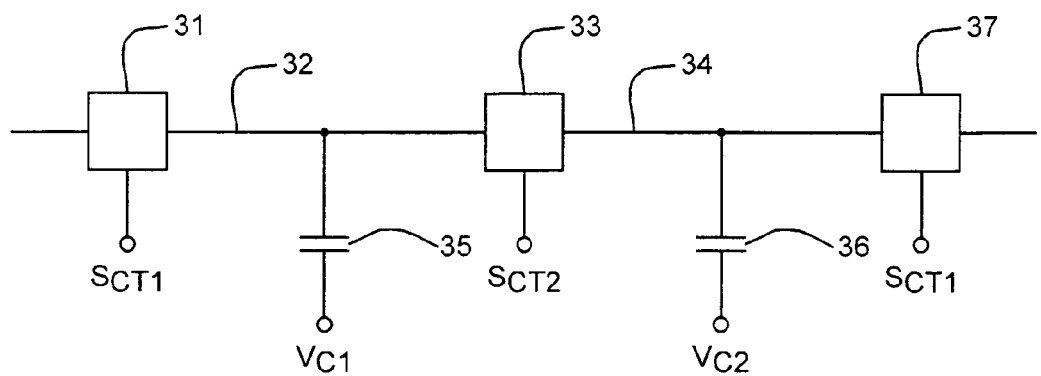
FIG. 6 shows a two-stage BBD charge pipeline.

FIG. 6 shows a pipeline segment containing two successive stages, each like the basic pipeline stage of FIG. 4. This pipeline segment consists of first charge-transfer circuit 31, first storage node 32, and first capacitor 35, together constituting the first pipeline stage; second charge-transfer circuit 33, second storage node 34, and second capacitor 36, together constituting the second pipeline stage; and third charge-transfer circuit 37, which is the entry point of a next pipeline stage which is not shown. Clock voltages $V_{C1}$ and $V_{C2}$ drive the two capacitors respectively; and digital clock signals $S_{CT1}$ and $S_{CT2}$ control the charge-transfer circuits.

Figure 7:
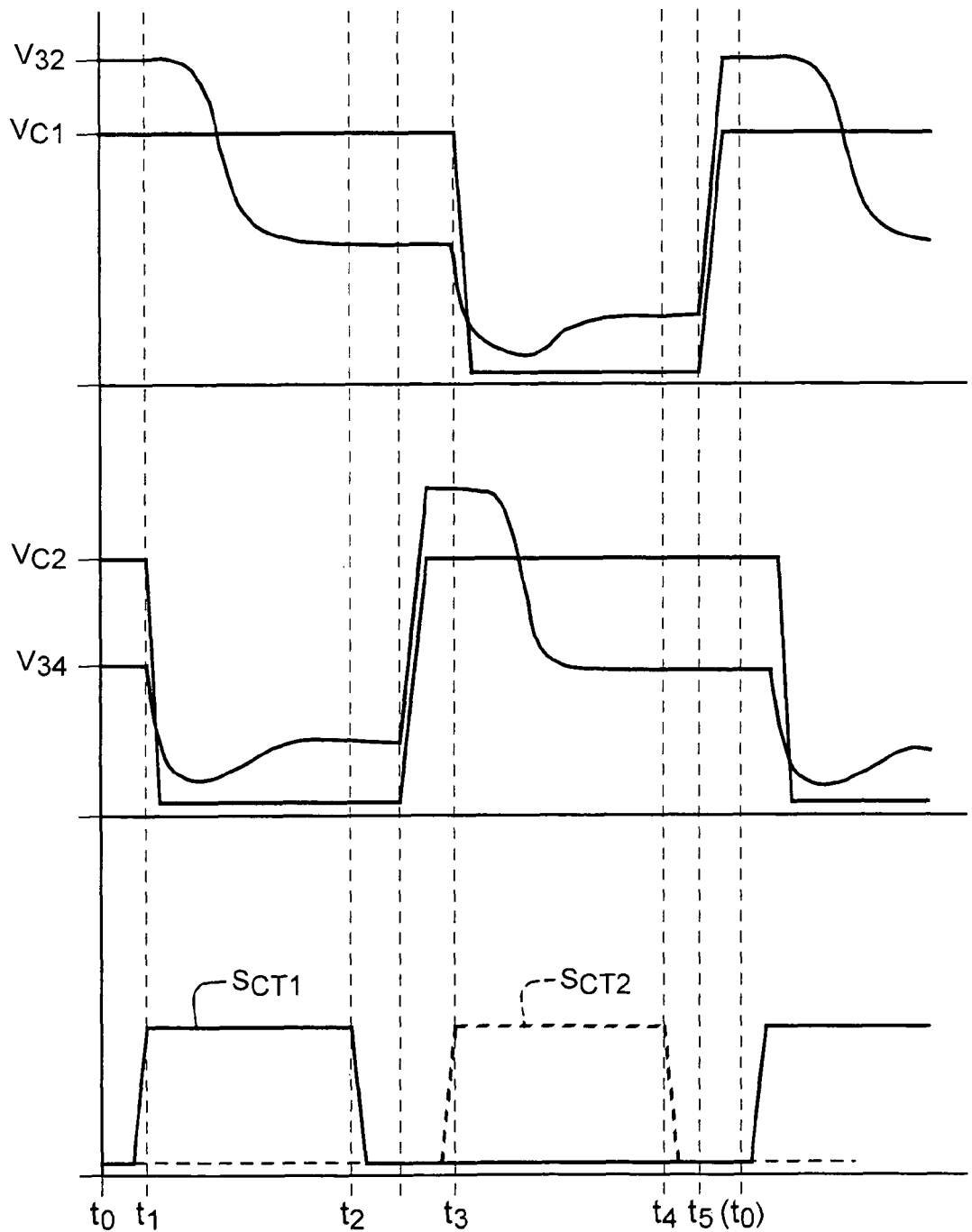
FIG. 7 shows timing diagrams for the pipeline stage of FIG. 4C.

The waveforms associated with the operation of the circuit of FIG. 6 are shown in FIG. 7. The waveforms pertaining to the first stage in FIG. 6, $V_{32}$ and $V_{C1}$, are identical with those of $V_2$ and $V_{C1}$ respectively in FIG. 5. The waveforms pertaining to the second stage in FIG. 6, $V_{34}$ and $V_{C2}$, are similar, but shifted by one-half of the clock cycle from those of the first stage. Thus the two stages of FIG. 63 operate on alternate half-cycles of the complete clock cycle. During the first half-cycle shown, when charge is transferring via charge-transfer circuit 31 into the first stage in FIG. 6, charge is transferring via charge-transfer circuit 37 out of the second stage (into the next stage, not shown). Likewise, during the second half-cycle, while charge is transferring out of the first stage via charge-transfer circuit 33, it is being transferred into the second stage.

In order to control the direction of charge transfer, it is necessary to selectively enable the appropriate charge-transfer circuits. The digital signals $S_{CT1}$ and $S_{CT2}$ provide this control. As shown in FIG. 7, $S_{CT1}$ is asserted (high) during the interval $t_1$-$t_2$. This control signal enables charge-transfer circuits 31 and 37, which are active during this interval as described above. During the corresponding interval in the second half-cycle, $t_3$-$t_4$, $S_{CT2}$ is asserted, enabling charge-transfer circuit 33. The exact means by which the digital signals $S_{CT1}$ and $S_{CT2}$ act to control the activity of the charge-transfer circuits is not pertinent to this invention. Some examples of such control are described in the aforementioned patent application (U.S. patent application Ser. No. 11/807,914, filed May 30, 2007 entitled "Boosted Charge Transfer Circuit").

The two-phase operating mode just described is used in all of the pipeline circuits described below, together with control (by signals equivalent to $S_{CT1}$ and $S_{CT2}$) of the charge-transfer circuits. In the interest of clarity, these details are not repeated in subsequent figures or descriptions.

In order to form a charge-domain ADC from a pipeline composed of stages similar to FIG. 4, a minimum of two operations in addition to charge storage and shifting are required: charges must be compared to a reference value, typically another charge; and a reference charge must be conditionally added to the signal charge (this 'addition' may be of either sign). In the ADC of this invention, these two operations are carried out in each of several pipeline stages. Implementation of these operations is explained below, beginning with the conditional addition of charge.

Figure 8:
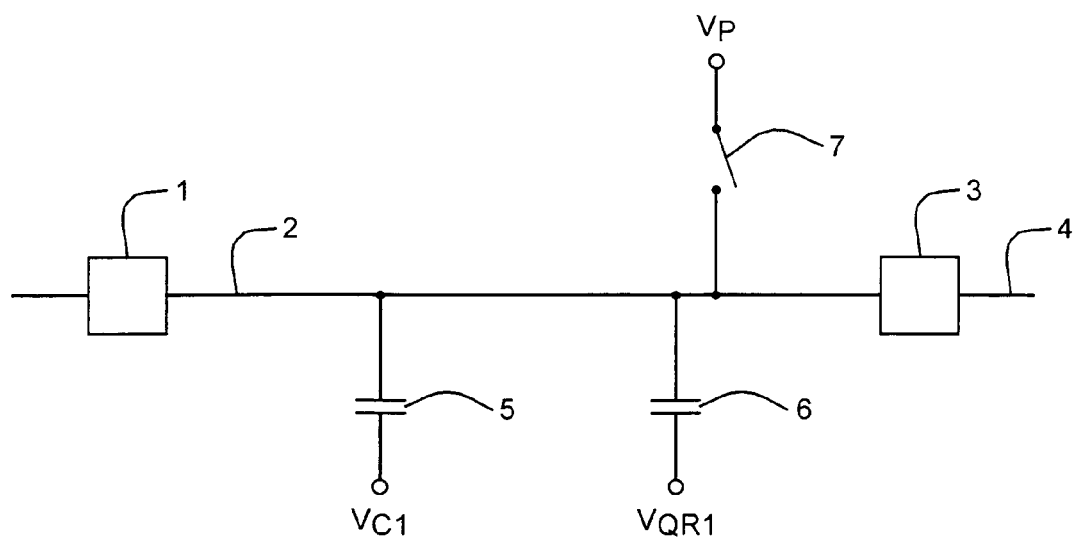
FIG. 8 shows a BBD charge-pipeline stage including conditional charge addition.
Figure 9:
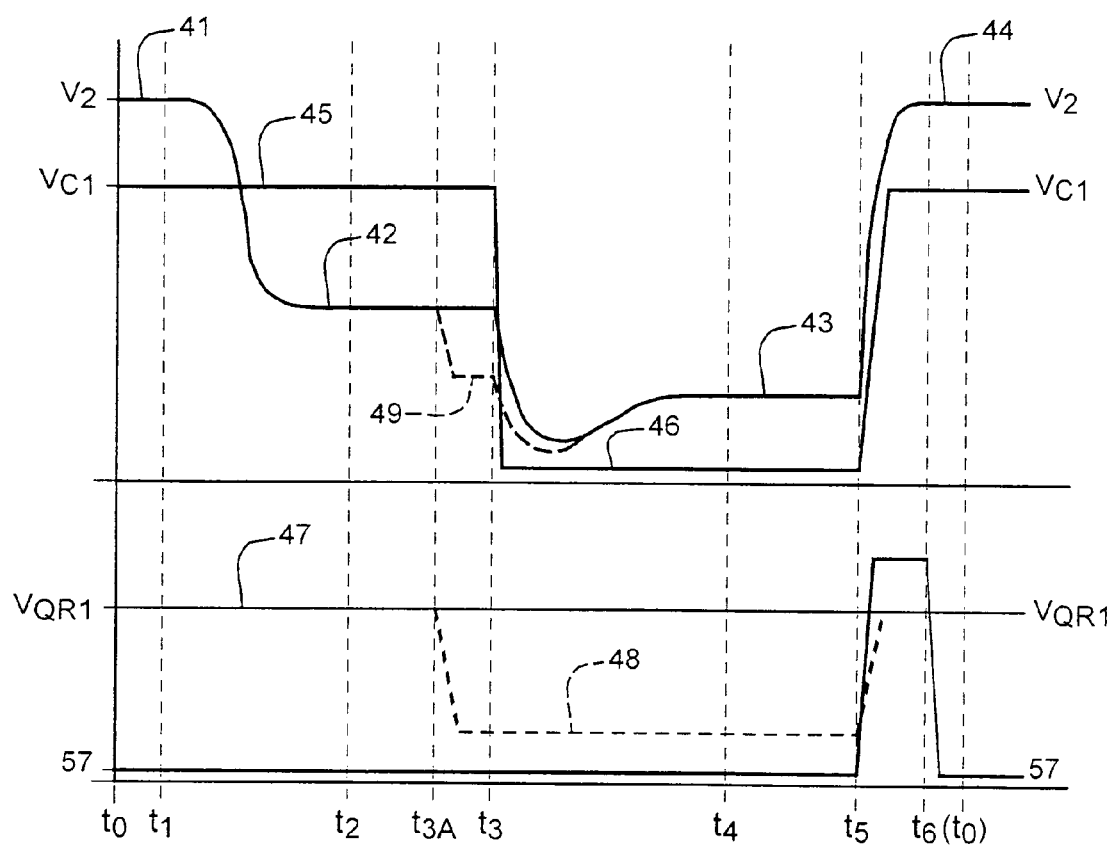
FIG. 9 illustrates voltage waveforms associated with FIG. 5.

The basic principle employed for conditional charge addition is depicted in FIG. 8, with operating waveforms shown in FIG. 9. For the purposes of this discussion, a single-ended stage is shown. In practical ADC designs, differential operation is usually preferred; both modes are possible within the scope of this invention.

The pipeline stage shown in FIG. 8 retains all the elements shown in FIG. 4. In addition, FIG. 8 includes two new elements: capacitor 6 (with value $C_6$) connected between charge-storage node 2 and voltage $V_{QR1}$; and switch 7 connected between node 2 and voltage $V_P$. Switch 7 is controlled by a periodic digital clock signal (identified as $S_7$ in FIG. 9).

FIG. 9 shows the operating waveforms of the circuit of FIG. 8. The initial conditions in FIG. 9 are similar to those in FIG. 5: $V_{C1}$ is at high voltage 45 and $V_2$, the voltage of node 2, is at high voltage 41. In addition, $V_{QR1}$ is at high voltage 47, and switch 7 is in an off state, indicated by the low value of its control signal $S_7$ in FIG. 9. As in FIG. 5, charge is transferred into the stage between $t_1$ and $t_2$, causing $V_2$ to fall in proportion to the incoming charge, settling at voltage 42. The change in $V_2$ due to incoming charge is inversely proportional to the total capacitance of node 2 as explained above. In FIG. 8 (neglecting parasitic capacitance) this total capacitance is $C=C_5+C_6$.

After the charge is transferred in, the additional features of FIG. 8 come into play. At time $t_{3A}$ voltage $V_{QR1}$ conditionally switches from its high state 47 to low state 48. This conditional transition of $V_{QR1}$ is coupled via $C_6$ to node 2 where, because of capacitive division, it produces a similar but smaller voltage change. The voltage at node 2 changes to voltage 49 (dashed line) if $V_{QR1}$ switches, and remains at voltage 42 (solid line) if it does not.

At time $t_3$, $V_{C1}$ switches from high voltage 45 to low voltage 46, instigating charge transfer out of the stage. As explained with reference to FIG. 5, node 2 is driven to a lower voltage due to coupling via capacitor 5. Charge-transfer circuit 3 removes charge from node 2 and transfers it to the next stage. By $t_4$ $V_2$ settles to voltage 43 which is independent of the charge previously on node 2, and charge transfer out of the stage is complete.

At $t_5$ both $V_{C1}$ and $V_{QR1}$ return to their initial high states (voltages 45 and 47 respectively). This transition is identical for $V_{C1}$ in every clock cycle. $V_{QR1}$, however, may already be at its high voltage 47, depending on whether or not it switched at $t_{3A}$. Thus the positive step coupled to node 2 at $t_5$ can have different values, depending on the state of $V_{QR1}$, resulting in a different final voltage. The added switch 7 in FIG. 5 is used to restore the voltage (and charge) on node 2 to a repeatable state regardless of the state of $V_{QR1}$ at $t_5$. Switch 7 is turned on, as indicated by the high state of its control signal $S_7$, during $t_5$-$t_6$, thus establishing a repeatable voltage at node 2 to begin the next cycle, so voltage 44=voltage 41. With an ideal switch, voltage 44=$V_P$; practical MOS switches introduce a small 'pedestal' so that voltage 44≠$V_P$. This non-ideality is, however, repeatable cycle-to-cycle, so the voltage 44=voltage 41 condition is still met in practical circuits.

Unlike the case of FIG. 4 where the charge transferred into the stage was subsequently transferred out without alteration, the outgoing charge in the circuit of FIG. 8 differs in general from the incoming charge:

$$Q_{OUT}=Q_{IN}+C_6\Delta V_{QR1}+Q_{CONST} \qquad \text{Equation 1}$$

where $C_6$ is the capacitance of capacitor 6, $\Delta V_{QR1}$ is the change in $V_{QR1}$ at $t_{3A}$, and $Q_{CONST}$ is a fixed charge which depends on $V_P$, voltages 43, 45, and 46, and the capacitor values. As is apparent in FIG. 9, $\Delta V_{QR1}$ is equal to (voltage 48−voltage 47) if $V_{QR1}$ switches, and is equal to zero if it does not. Note that both $C_6\Delta V_{QR1}$ and $Q_{CONST}$ can be either positive or negative quantities.

When the circuit of FIG. 8 is used to form one stage of a pipelined ADC, the quantity (voltage 48−voltage 47) is made equal to a reference voltage; for convenience it will be called $V_{R1}$. Correspondingly, the quantity $C_6V_{R1}$ becomes a reference charge, since $C_6$ is fixed in a given instantiation. Thus the conditional choice of $\Delta V_{QR1}=V_{R1}$ or $\Delta V_{QR1}=0$ at $t_{3A}$ corresponds in Equation 1 to the conditional addition of a reference charge $C_6V_{R1}$ to the incoming charge packet $Q_{IN}$. The circuit of FIG. 8 thus provides one of the two operations required for charge-domain ADC implementation.

Note that the exact position of time $t_{3A}$ is not critical to the operation of the circuit of FIG. 8. The conditional transition of $V_{QR1}$ can occur at any time between $t_0$ and $t_3$ with no change in circuit performance; under some practicable conditions it may also occur in the $t_3$-$t_4$ interval.

Figure 10:
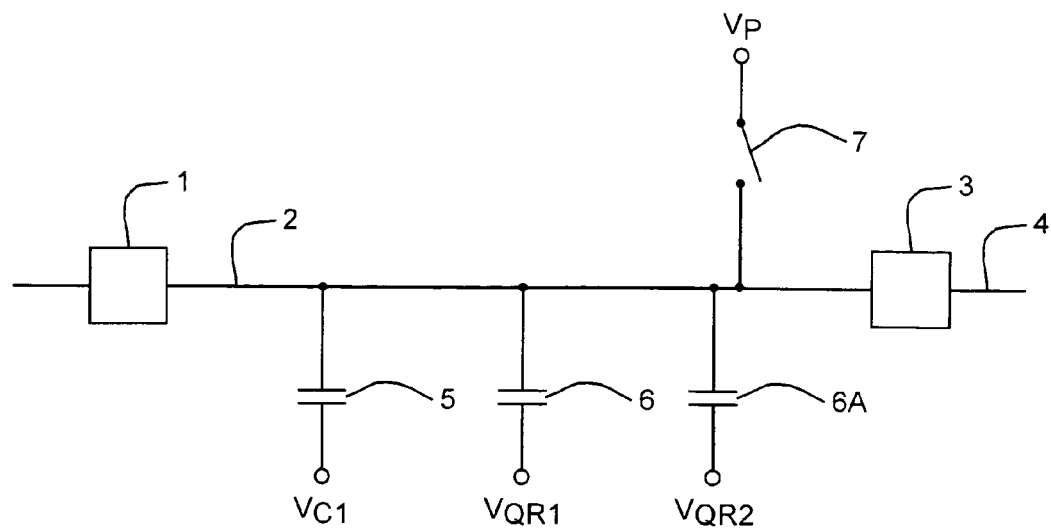
FIG. 10 shows a BBD charge-pipeline stage including conditional charge addition, with the added charge composed of two independent components.

In some ADC implementations it is desirable to provide more than one conditional charge addition in a single pipeline stage. An example of such a stage is shown in FIG. 10. This circuit includes, in addition to the elements in FIG. 8, additional capacitor 6A and voltage source $V_{QR2}$. The operation of such a stage is identical to that of FIG. 8, except that at $t_{3A}$ each of the voltages $V_{QR1}$ and $V_{QR2}$ undergoes an independent conditional transition, of size $V_{R1}$ or $V_{R2}$ respectively. The resulting charge transfer function of the stage is given by:

$$Q_{OUT}=Q_{IN}+C_6\Delta V_{QR1}+C_6\Delta V_{QR2}+Q_{CONST} \qquad \text{Equation 2}$$

The same principle can be extended to any number of capacitors and $V_R$ values.

Figure 11:
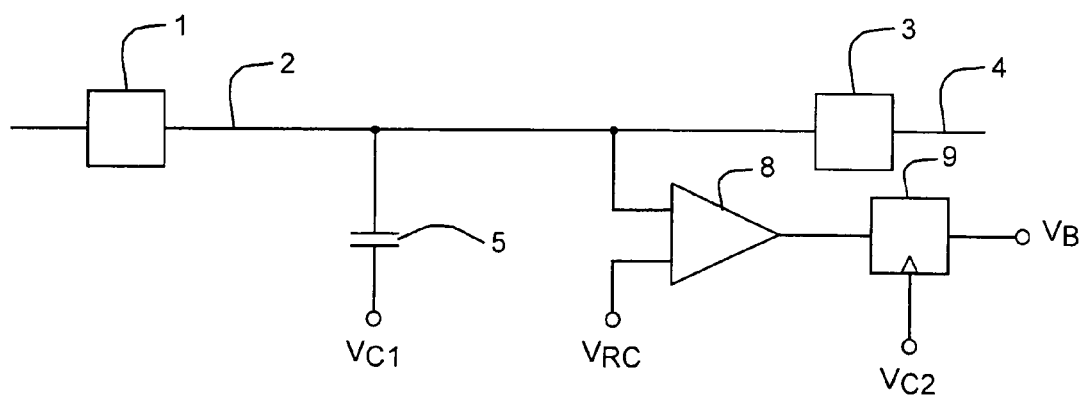
FIG. 11 shows a single-ended BBD charge-pipeline stage including charge comparison.

The remaining operation required for charge-domain ADC operation is charge comparison. FIG. 11 shows a circuit which provides this operation. The circuit of FIG. 11 is identical to that of FIG. 4, with the addition of voltage comparator 8 and latch 9.

Comparator 8 compares the voltage of node 2 with a reference voltage $V_{RC}$. As was pointed out in connection with FIGS. 4 and 5, the voltage at node 2 after $t_2$ depends on the amount of charge transferred into the stage: in FIG. 5, for example, two different incoming charge quantities result in voltages 22A and 22B respectively at node 2. Because of this dependence, voltage comparator 8 accomplishes a comparison of charge on node 2 vs. a reference. Latch 9 captures the result of this comparison at a time between $t_2$ and $t_3$ defined by the digital clock signal $V_{C2}$, and provides a digital output voltage $V_B$.

As was mentioned above, many practical charge-domain pipelined ADCs employ differential circuitry. In such circuitry, signals are represented by pairs of charges whose difference is proportional to the signal. This arrangement permits representation of bipolar signals with unipolar charge packets, and can also provide dynamic range and noise-immunity benefits.

Figure 12:
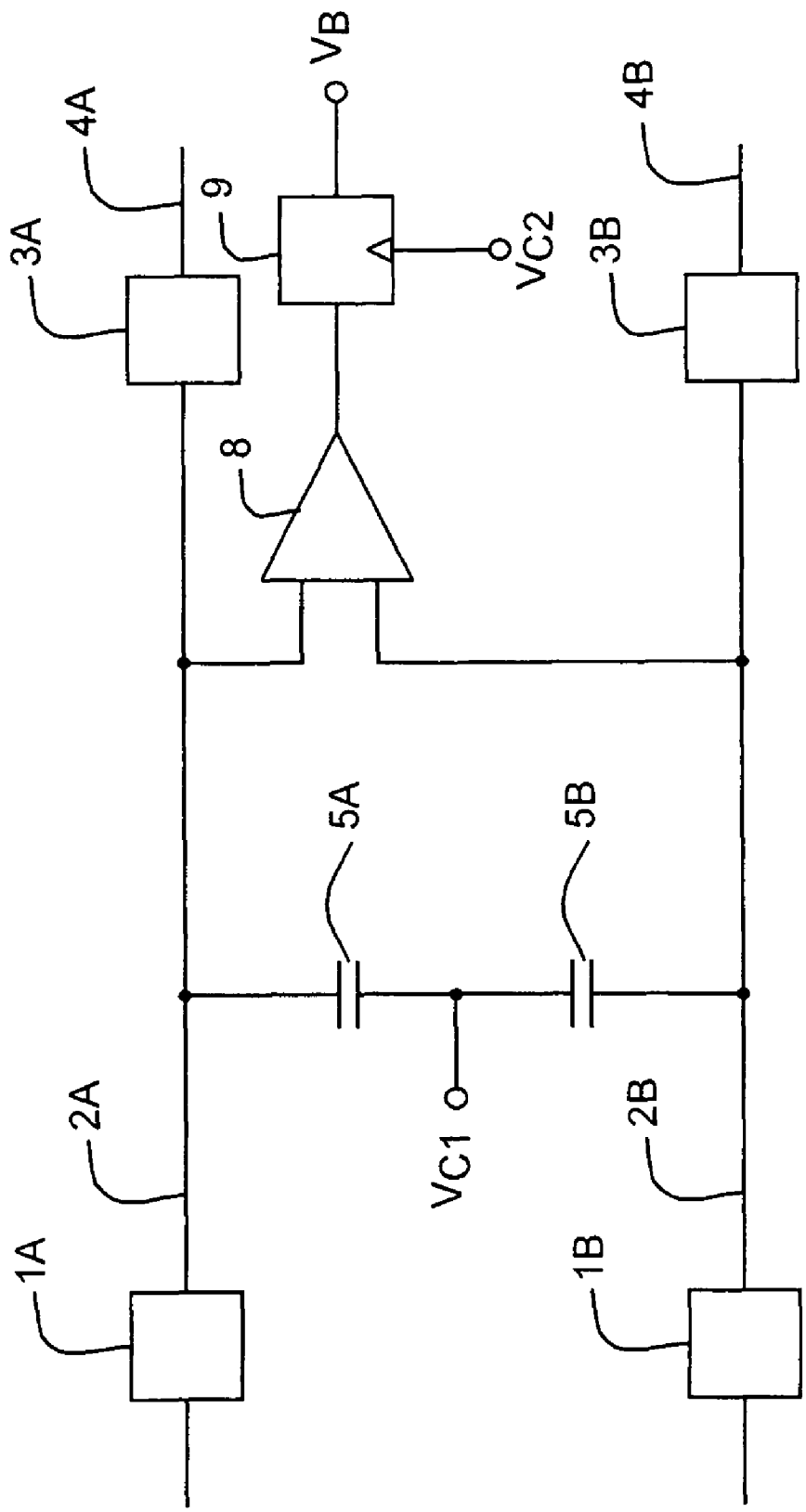
FIG. 12 shows a differential BBD charge-pipeline stage including charge comparison.

FIG. 12 illustrates a differential pipeline stage which is functionally similar to the single-ended stage of FIG. 11. The circuit of FIG. 12 contains two charge pipelines, each identical to that of FIG. 4. The upper pipeline contains elements 1A, 2A, 3A, 4A and 5A, equivalent to elements 1, 2, 3, 4, and 5 in FIG. 4. The lower pipeline contains elements 1B . . . 5B, also equivalent to elements 1 . . . 5 of FIG. 1. The latch 9 in this circuit serves the same function as in FIG. 11. In this differential configuration, however, the comparator 8 compares the voltages of the two charge storage nodes 2A and 2B, rather than comparing to a fixed reference as in FIG. 11. Thus the comparator decision in FIG. 12 is based on the sign of the differential charge signal during the $t_2$-$t_3$ interval.

The several circuit configurations described above provide all the operations needed to carry out pipelined charge-domain A/D conversion: namely charge storage and transfer, charge comparison, and conditional and constant charge addition. These operations can be combined in various ways to carry out a variety of ADC algorithms. Two examples of ADCs based on these operations are given below: one which implements a basic one-bit conversion per pipeline stage; and one which implements an RSD (sometimes called "1.5 bit") conversion per pipeline stage.

Figure 13:
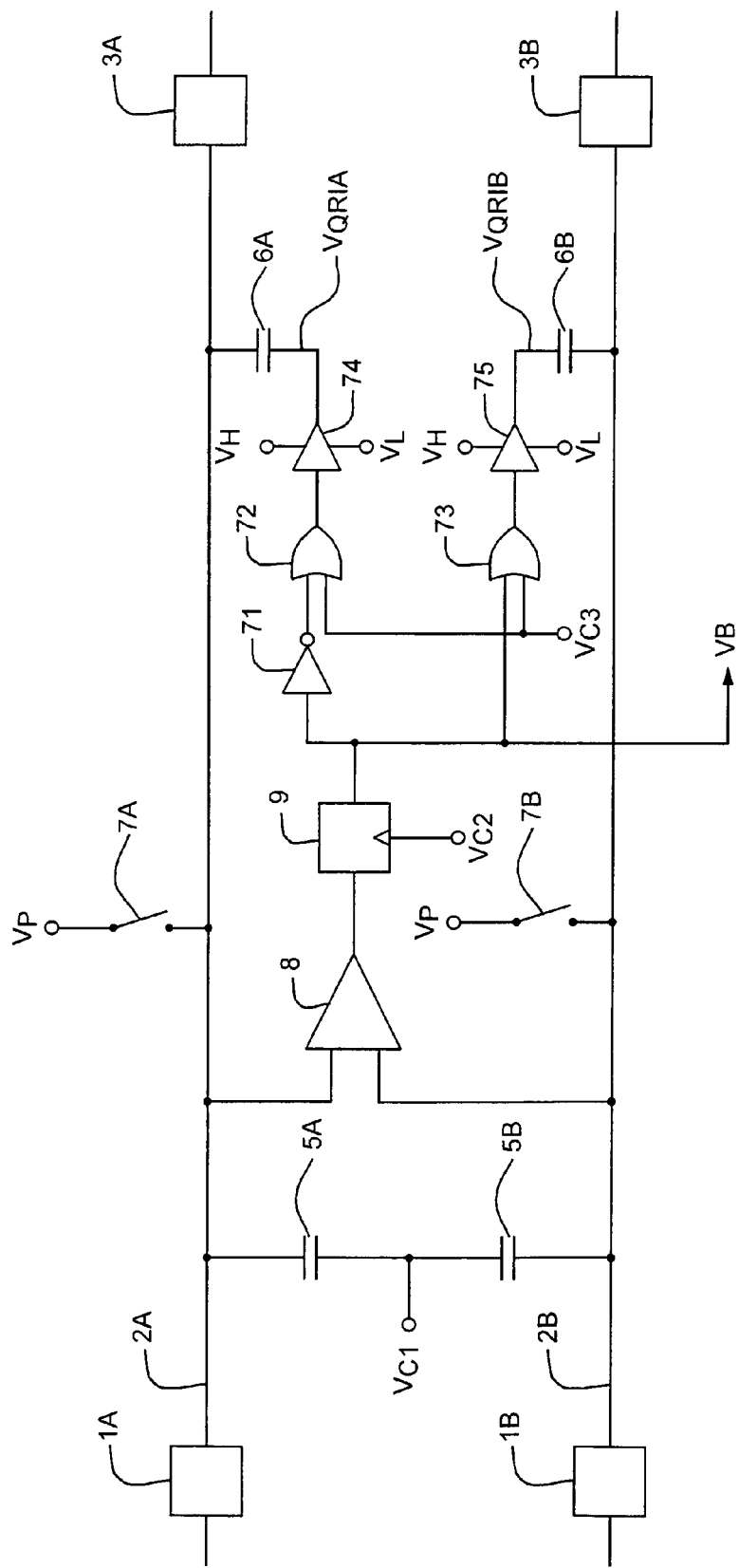
FIG. 13 shows one stage of a differential charge-pipeline ADC which resolves one bit per stage.

FIG. 13 illustrates a differential charge-domain pipeline ADC stage which resolves one bit per stage. The circuit shown combines the basic differential pipeline, comparator, and latch of FIG. 12 with the conditional charge-addition capability of FIG. 8 (used here in differential form). These elements are all identified similarly to the corresponding elements in the previous figures, and operate in the same manner. In addition the circuit of FIG. 13 includes a block of logic circuitry consisting of inverter 71 and OR-gates 72 and 73, plus level-shifters 74 and 75.

In operation, each of the two pipelines operates like the circuit of FIG. 8, with $V_{QR1A}$ and $V_{QR1B}$ each functioning for its respective pipeline like $V_{QR1}$ in FIG. 8. The logic block in FIG. 13 causes either $V_{QR1A}$ or $V_{QR1B}$ (but not both) to switch from a high to a low state at the appropriate time. The exact high and low voltages, $V_H$ and $V_L$, are provided in response to the logic levels at the OR-gate outputs by the level shifters 74 and 75. Operating waveforms for each of the two pipelines in this circuit are the same as those in FIG. 9. Clock voltage $V_{C3}$ determines the timing of $V_{QR1A/B}$ switching, equivalent to $t_{3A}$ in FIG. 9. Latch 9 is clocked (by clock voltage $V_{C2}$) at a time before or coincident with $V_{QR1A/B}$ switching.

As a result of these operating conditions, the two pipelines in FIG. 13 process charge in accordance with the following equations:

$$Q_{OUTA} = Q_{INA} + C_6 \Delta V_{QR1A} + Q_{CONST} \qquad \text{Equation 3A}$$

$$Q_{OUTB} = Q_{INB} + C_6 \Delta V_{QR1B} + Q_{CONST} \qquad \text{Equation 3B}$$

where $C_6$ is the value of capacitors 6A and 6B and $\Delta V_{QR1A}$ and $\Delta V_{QR1B}$ are equal either to $\Delta V_R = V_L - V_H$, or to zero. (It is assumed here for simplicity that the values of capacitors 6A and 6B are equal, and that both are driven by the same value of $\Delta V_{QR}$; neither of these constraints are essential.) The dependence of the conditional charges in equations 3A and 3B on the comparator decision can be expressed as:

$$C_6 \Delta V_{QR1A} = b C_6 \Delta V_R \qquad \text{Equation 4A}$$

$$C_6 \Delta V_{QR1B} = (1-b) C_6 \Delta V_R \qquad \text{Equation 4B}$$

where b is the value of the output bit decision, with value 1 or 0.

In the differential pipeline configuration, the signal is represented by the difference between the "A" charge and the "B" charge: $Q = Q_A - Q_B$. Thus Equations 3A, 3B, 4A and 4B may be combined to express the overall stage transfer function for differential signal charge:

$$Q_{OUT} = Q_{IN} + (2b-1)C_6 \Delta V_R = Q_{IN} + (2b-1)Q_{STAGE} \qquad \text{Equation 5}$$

where we have defined $Q_{STAGE} = C_6 \Delta V_R$. Equation 5 shows that the stage either adds $Q_{STAGE}$ to the incoming charge (if b=1) or subtracts $Q_{STAGE}$ from the incoming charge (if b=0). This operation is recognizable as one step in the well-known successive-approximation algorithm for A/D conversion, as applied to a signed signal.

A pipeline of N such stages thus produces the charge transfer function:

$$Q_{OUT(N)} = Q_{IN} + (2b-1)Q_{STAGE(1)} + (2b_2-1)Q_{STAGE(2)} \ldots + (2b_N-1)Q_{STAGE(N)} \qquad \text{Equation 6}$$

If each stage-charge $Q_{STAGE(k+1)}$ is smaller than the preceding one, $Q_{STAGE(k)}$, then this series of charge comparisons and (signed) additions converges towards $Q_{OUT(N)} = 0$. In particular, if the stage-charges are scaled such that $Q_{STAGE(k+1)} = (\frac{1}{2}) \cdot Q_{STAGE(k)}$, then the sequence of comparator decisions $b_1, b_2, \ldots b_N$ constitute the bits of an N-bit offset-binary approximation to the ratio $Q_{IN}/2Q_{STAGE(1)}$. In this case, the full-scale-range that can be approximated is $-2Q_{STAGE(1)} \leq Q_{IN} < 2Q_{STAGE(1)}$.

One property of this algorithm is that, for pipeline input signals that are within the full-scale range of the conversion process, the output differential charge from each stage (k) obeys the condition:

$$|Q_{OUT(k)}| \leq |Q_{STAGE(k)}| \qquad \text{Equation 7}$$

Thus each successive stage needs to process less differential charge than the previous stage. For binary stage scaling, each successive stage needs to process at most half the charge of the previous stage. This fact makes possible another advantage of the present invention.

As was pointed out above, the voltage change at the charge storage node (node 2 in FIG. 8, for example) is $\Delta V = Q_{IN}/C$, where C is the total capacitance at the node. In a practical charge-domain circuit, the maximum voltage change $\Delta V$ at the storage node must be constrained within limits dictated by the semiconductor process used, available clock voltages, etc. For a given charge entering the stage, such limits impose a minimum possible size on total node capacitance in the stage; if we call the maximum allowable voltage swing at the charge storage node $\Delta V_{MAX}$, then we can express the limit on node capacitance as:

$$C_{NODE} > Q_{IN}/\Delta V_{MAX} \qquad \text{Equation 8}$$

A large $C_{NODE}$ value, however, has a disadvantage: it reduces the voltage presented to the comparator by a given charge signal. Consequently for a given comparator voltage resolution (limited by voltage noise or offset, for example) the minimum resolvable charge is inversely proportional to $C_{NODE}$. It would be desirable to reduce $C_{NODE}$ as much as possible, in order to maximize charge resolution (and thus overall ADC resolution in effective bits). Thus the constraint in Equation 8 is in conflict with the goal of high ADC resolution.

A preferred implementation provides a means of satisfying Equation 8 while providing high ADC resolution. Equation 7 indicates that the differential charge signal which each stage in a pipeline needs to process is reduced compared to the previous stage. (It is reduced by a factor of two in a binary pipeline.) Thus the minimum allowable node capacitance required to satisfy Equation 8 with respect to the differential signal charge is smaller for each successive pipeline stage. In order to exploit this opportunity, however, not only the differential charge, but the individual charges comprising the differential pair must be reduced at each successive stage.

The common-mode (CM) charge at each stage is defined as the average of these two charge packets. Even though the signal charge (i.e., the charge-packet difference) is reduced at each stage by the combined actions of comparator and charge addition, the CM charge is not. Using its definition, we can combine Equations 3A, 3B, 4A and 4B and the definition of $Q_{STAGE}$ to obtain:

$$Q_{CM\text{-}OUT} = 1/2(Q_{OUTA} + Q_{OUTB})$$
$$= 1/2\{(Q_{INA} + Q_{INB}) +$$
$$[b + (1-b)]C_6 \Delta V_R + 2Q_{CONST}\}$$
$$= Q_{CM\text{-}IN} + 1/2 C_6 \Delta V_R + Q_{CONST}$$
$$= Q_{CM\text{-}IN} + 1/2 Q_{STAGE} + Q_{CONST}$$

Equation 9 shows that the CM charge changes at each stage by a fixed amount characteristic of that stage. (This amount is independent of the stage's bit decision.) As discussed above, $Q_{STAGE}$ depends on $C_6$ and $\Delta V_R$, while $Q_{CONST}$ depends on $C_5$ and several other voltages. Thus it is possible to select values of $C_6$ and $V_P$, for example, to cause $Q_{CM\text{-}OUT}$ to decrease from stage to stage just as $Q_{STAGE}$ does. The result is that the total capacitance of each stage can be made smaller than the previous one; for binary scaling, it can be approximately one-half the size.

The pipelined ADC architecture incorporating this charge and capacitance reduction from stage to stage is termed a "tapered pipeline". It has several important advantages over prior-art BBD-based ADCs: by reducing total capacitance for a series of stages, it reduces operating power; for the same reason it reduces the total "kTC" noise added in the pipeline (thus improving ADC resolution); it increases the charge resolution of comparators in later stages of the pipeline, thus making possible higher overall resolution; and it reduces the total capacitance required for the pipeline, thus reducing circuit area.

In order to exploit the increased comparator charge resolution available in later pipeline stages in a tapered pipeline, an algorithm must be employed which prevents inexact comparator decisions in early stages from compromising precision of the final A/D conversion. A well-known solution to this requirement is the employment of redundancy, such that later stages are able to correct for inexact early decisions. A widely-used algorithm based on this concept is the RSD (sometimes referred to as the "1.5 bit-per-stage") algorithm. In this approach, each pipeline stage has two independent comparators with differing thresholds, and two corresponding pairs of conditionally-switched capacitors. The RSD algorithm has been widely implemented in switched-capacitor pipelines, but not previously in charge-domain pipelines. Its use in a BBD charge pipeline is one feature of the present invention.

Figure 14:
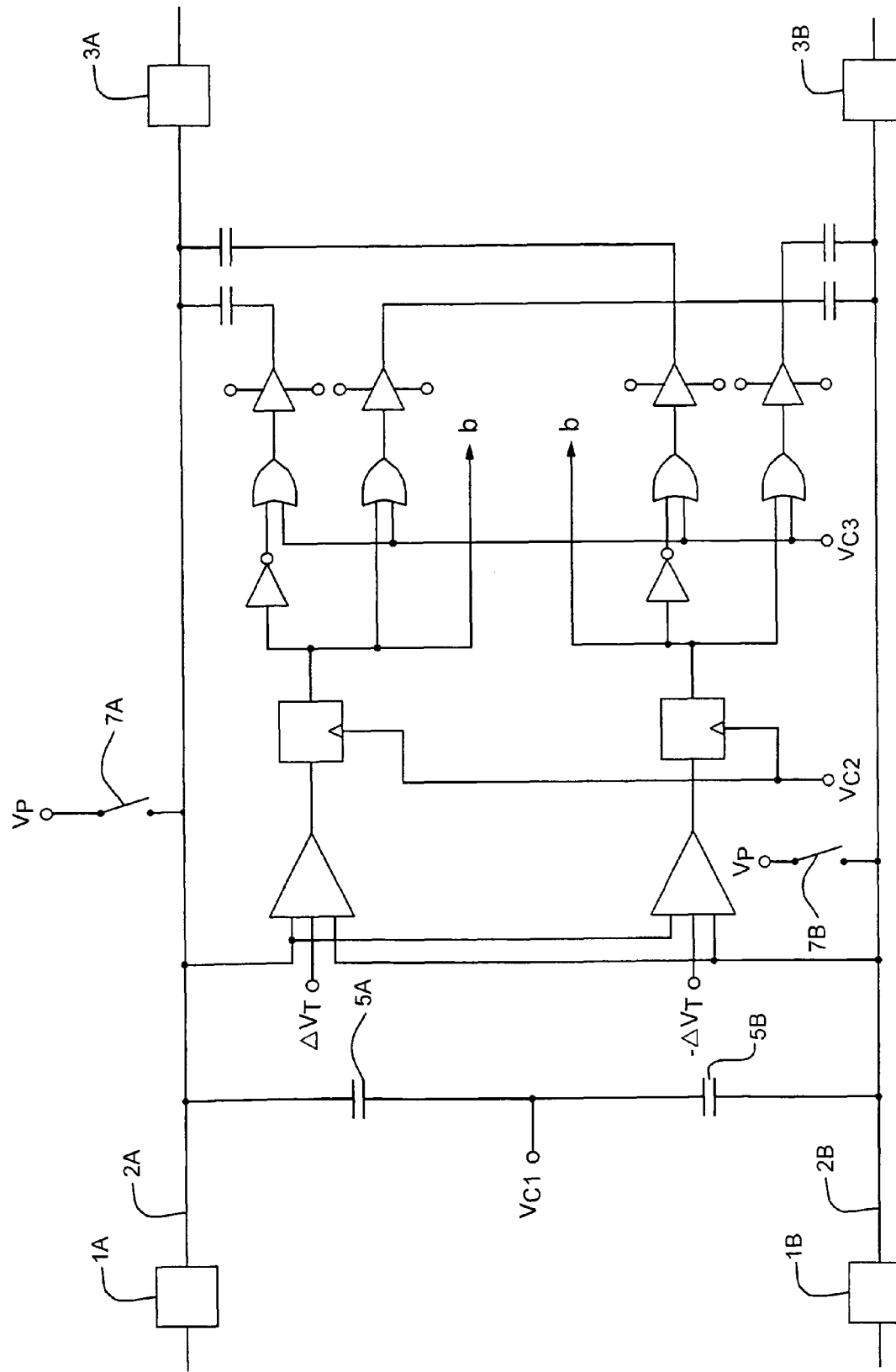
FIG. 14 shows one stage of a differential charge-pipeline ADC which implements the so-called RSD algorithm.

FIG. 14 illustrates one stage of a differential charge-domain pipeline ADC stage which implements the RSD algorithm. It is similar to the circuit of FIG. 13, except that the comparator, latch, logic block, and conditionally-switched capacitors are duplicated. Moreover, the two comparators are provided with shifted thresholds, such that each one switches at a specific charge imbalance between the "A" and "B" storage nodes, rather than switching at the point of balance as in FIG. 10. The comparators typically, although not necessarily, have thresholds symmetrical about the balance point, as indicated in FIG. 14. The two latched comparator decisions are output from the stage as digital signals b and b'.

Assuming that the stage of FIG. 14 is placed in a pipeline where its input charge range is the same as that of the binary stage of FIG. 13, then each of the conditionally-switched capacitors in FIG. 14 is half the size of the corresponding capacitors in FIG. 13. Thus, if both comparators in FIG. 14 are driven to the same decision, indicating a large charge difference between the "A" and "B" storage nodes, then both output bits b and b' have the same value, and both conditionally-switched capacitors on the same branch of the differential charge pair are switched. In this case the stage charge transfer function is given by Equation 5, just as with the circuit of FIG. 13. If the input charge is nearly balanced, however, then b and b' are complementary, and a charge of ½ $Q_{STAGE}$ is added to each outgoing charge packet. In this case the outgoing (differential) signal charge is not changed ($Q_{OUT}=Q_{IN}$).

One result of these operations is that the stage's output charge still obeys Equation 7. Another is that the extra bit resolved per stage provides the desired redundancy, so that later bit-decisions can be used to correct earlier, less exact ones. Thus the improved charge resolution in later stages, provided by the tapered pipeline, can be used to provide overall improved ADC resolution. The charge scaling from stage to stage in this example is still a factor of 2, just as with the binary pipeline ADC described above.

The tapered-pipeline principle has been described principally with reference to a differential charge pipeline. In some applications, such as those where the input signal to be converted is a single-ended charge (as in an imager), a single-ended ADC pipeline configuration is preferable. The tapered-pipeline principle can be applied equally well to such applications.

The above has illustrated two example applications of A/D conversion techniques used to implement a 10 GE interface. Similar methods, based on the same principles, will be apparent to those familiar with the current ADC art. Examples include pipeline ADCs resolving two or more bits per stage, by using multiple comparators and conditionally-switched capacitor pairs.

While this invention has been particularly shown and described with references to example embodiments thereof, it will be understood by those skilled in the art that various changes in form and details may be made therein without departing from the scope of the invention encompassed by the appended claims.

What is claimed is:

1. A network communication interface apparatus comprising:
   an analog front end, for coupling to a cable to receive a communication signal;
   a charge-domain pipeline analog to digital converter (ADC) comprising two or more Bucket Brigade Devices (BBD), and coupled to receive the communication signal at an input, and to provide a digital representation thereof at an output, and
   wherein the BBDs use boosted bucket-brigade charge transfer.

2. The apparatus of claim 1 wherein the BBDs use conditional charge addition in at least one stage.

3. The apparatus of claim 2 wherein the charge-domain pipeline ADC has at least one stage wherein charge is conditionally added to either one but not both charge packets of a differential pair of charges.

4. The apparatus of claim 1 wherein the charge-domain pipeline ADC provides charge comparison against a reference in at least one stage.

5. The apparatus of claim 1 wherein the charge-domain pipeline ADC is a differential charge pipeline using bucket-brigade charge transfer with charge comparison between differential charge-pairs in at least one stage.

6. The apparatus of claim 1 wherein the charge-domain pipeline ADC is a differential charge-domain pipeline using bucket-brigade charge transfer having, in at least one stage, at least two charge comparisons with differing thresholds between differential charge-pairs.

7. The apparatus of claim 1 wherein later stage pipeline stages employ smaller capacitance than earlier stages.

8. A network communication interface apparatus comprising:
   an analog front end, for coupling to a cable to receive a communication signal;
   a charge-domain pipeline analog to digital converter (ADC), coupled to receive the communication signal at an input, and to provide a digital representation thereof at an output; and
   wherein the charge-domain pipeline ADC further comprises:
   a first charge transfer circuit;
   a second charge transfer circuit;
   a node coupled to the first charge transfer circuit and the second charge transfer circuit;
   a capacitor coupled to the node and to a clocked voltage;
   a switched voltage coupled to the node; and
   at least one of the first or second charge transfer circuits being a boosted charge transfer circuit.

9. The apparatus of claim 8 additionally comprising:
   control circuitry configured to provide independent control of charge storage and charge transfer timing between the first charge transfer circuit and the second charge transfer circuit.

10. The apparatus of claim 9 wherein the control circuitry provides control of charge-transfer direction in the pipeline.

11. The apparatus of claim 9 comprising:
    a second capacitor coupled to the node and to a conditional voltage, the second capacitor configured to provide conditional charge to the node.

12. The apparatus of claim 11 wherein the second capacitor provides conditional charge to the node based on a comparison of the voltage of the node with a reference voltage.

13. The apparatus of claim 11 further comprising a plurality of capacitors coupled to the node and to conditional voltages, each of the plurality of capacitors configured to provide conditional charge to the node.

14. The apparatus of claim 8 arranged to provide a differential charge domain pipeline and further comprising:
    a third charge transfer circuit,
    a fourth charge transfer circuit,
    a second node coupled to the third charge transfer circuit and the fourth charge transfer circuit;
    a second capacitor coupled to the node and to a second clocked voltage; and
    a third and fourth capacitor coupled respectively to the first node and second node and configured to provide conditional charge to either the first charge transfer circuit or the third charge transfer circuit.

15. The apparatus of claim 14 wherein at least one of the third charge transfer circuit or the fourth charge transfer circuit is a boosted charge transfer circuit.

16. The apparatus of claim 14 wherein the third capacitor provides conditional charge based on a comparison of the voltages of the first node and the second node.

17. The apparatus of claim 14 further comprising a plurality of conditional charge capacitors coupled to the first and second node and configured to provide conditional charge to either the first charge transfer circuit or the third charge transfer circuit.

18. The apparatus of claim 17 wherein the plurality of capacitors provide conditional charge based on comparisons of the voltages of the first node and the second node at different thresholds.

19. A network communication interface apparatus comprising:
    an analog front end, connected to receive a 10 Gigabit Ethernet compatible input signal; and
    a pipelined charge domain analog-to-digital converter using bucket brigade charge transfer, coupled to receive the input signal and further comprising:
    a first charge transfer circuit;
    a second charge transfer circuit;
    a node coupled to the first charge transfer circuit and the second charge transfer circuit;
    a first clocked capacitor coupled to the node and to a clocked voltage;
    a plurality of conditional charge capacitors coupled to the node and to conditional voltages, each of the plurality of conditional charge capacitors configured to provide conditional charge to the node.

20. The apparatus of claim 19 additionally comprising:
    a third charge transfer circuit,
    a fourth charge transfer circuit,
    a second node coupled to the third charge transfer circuit and the fourth charge transfer circuit;
    a second clocked capacitor coupled to the node and to a clocked voltage;
    a second plurality of conditional charge capacitors coupled to the first node and second node and configured to provide conditional charge to either the first charge transfer circuit or the third charge transfer circuit based on comparisons of the voltages of the first node and the second node at different thresholds.

21. The apparatus of claim 19 wherein the pipeline implements an RSD analog-to-digital conversion algorithm.

22. The apparatus of claim 19 wherein the pipeline implements binary stage scaling.

23. The apparatus of claim 19 arranged to provide a differential charge domain pipeline and further comprising:
    a third charge transfer circuit;
    a fourth charge transfer circuit; and
    a third and fourth capacitor coupled to the first node and second node respectively and configured to provide conditional charge to either the first charge transfer circuit or the third charge transfer circuit.

* * * * *